United States Patent [19]

Smathers

[11] Patent Number: 4,973,527
[45] Date of Patent: Nov. 27, 1990

[54] PROCESS FOR MAKING FILAMENTARY SUPERCONDUCTORS USING TIN-MAGNESIUM EUTECTICS

[75] Inventor: David B. Smathers, Salem, Oreg.

[73] Assignee: Teledyne Industries, Inc., Albany, Oreg.

[21] Appl. No.: 412,204

[22] Filed: Sep. 25, 1989

[51] Int. Cl.[5] .................. H01L 39/24; H01L 39/00
[52] U.S. Cl. ......................... 428/930; 29/599; 148/11.5 F; 148/11.5 Q; 148/12.7 B; 148/133; 420/901
[58] Field of Search ............. 148/11.5 F, 11.5 Q, 148/12.7 B, 133; 428/930; 420/901; 29/599

[56] References Cited

U.S. PATENT DOCUMENTS

| | | | |
|---|---|---|---|
| 4,262,412 | 4/1981 | McDonald | 29/599 |
| 4,411,712 | 10/1983 | Marancik | 148/11.5 F |
| 4,414,428 | 11/1983 | McDonald | 428/660 |
| 4,419,145 | 12/1983 | Tachikawa et al. | 148/11.5 F |
| 4,447,946 | 5/1984 | Marancik | 148/133 |
| 4,505,762 | 3/1985 | Fukutsuka et al. | 148/11.5 F |
| 4,531,982 | 7/1985 | Dubots | 148/11.5 F |
| 4,767,470 | 8/1988 | Tachikawa et al. | 148/133 |

OTHER PUBLICATIONS

Togano et al, Journ. Less-Common Metals 68 (1979) 15.
Wu et al, IEEE Trans-Magnetics, vol. 19 (1983) 1437.

*Primary Examiner*—Upendra Roy
*Attorney, Agent, or Firm*—Shoemaker and Mattare, Ltd.

[57] ABSTRACT

A method is disclosed for fabricating a wire from niobium tin produced in situ in a filamentous structure capable of achieving the superconducting state which comprises overlapping a tin alloy core comprised of tin-magnesium eutectic alloy with alternating layers of copper and foraminous layers followed by drawing the thus-formed niobium filaments into wire, then heating the wire at sufficiently high temperature to cause the eutectic alloy to homogeneously diffuse through the length of the copper wire and rods to react with the Nb, forming the A-15 crystal structure of $Nb_3Sn$, characterized by refined grain structure therein and improved current carrying capability.

9 Claims, 6 Drawing Sheets

PROCESS FOR MAKING FILAMENTARY SUPERCONDUCTORS USING TIN-MAGNESIUM EUTECTICS

BACKGROUND OF THE INVENTION

This invention relates to superconducting states and processes and products useful in achieving superior superconducting properties and results.

Of the two commercially available and useful bulk superconductors, NbTi and Nb3Sn, NbTi is used in more applications because it is more ductile while Nb3Sn has superior superconducting properties but, in comparison to NbTi, its useful forms have generally had less desirable mechanical properties.

The absence of good ductility characteristics of Nb3Sn type superconductor structures has been substantially overcome by the so called "bronze" process, whereby the niobium and Sn are processed as separate metallurgical phases in a composite. A reaction heat treatment is applied to the finished wire. During this treatment, tin from the copper-tin bronze alloy reacts with the niobium to form the A-15 crystal structure of Nb3Sn at temperatures below 930° C. Copper is required as another element to stabilize or catalyze the formation of Nb3Sn over more tin-rich niobium phases.

Typical structures and methods for their preparation are shown in U.S. Pat. Nos. 4,262,412 and 4,414,428 to McDonald, the descriptions of which are incorporated herein by reference in their entirety.

So called modified jelly roll (MJR) as described in the foregoing patents, is incorporated herein by reference and is used in the processes for preparing the products of this invention.

While variations of many of the bronze processes exist including those which comprise alloys with various other elements such as Ga, Ti, Mg[1,2], and the like, and the niobium filament can be further alloyed with small amounts of Ti, Ta, Zr, Hf, Sn, Fe, and V, the overall current density in such structures is affected, i.e., diluted, by the amount of tin-containing bronze that is required to convert substantially all the niobium to Nb3Sn.

Increased ductility in wire drawing processes is achieved by separating the tin and copper as distinct phases which can be heavily worked without the annealing normally necessary with bronze after working.

In addition to the improved ductility, the separation of tin and copper allows the volume fraction of niobium to be increased while maintaining an adequate volume of tin for complete reaction. Thus, the Nb content of the non-copper volume of the wire, and subsequently Nb3Sn, is less diluted by the nondispersable metallic content.

There can be further improvements where, as in the above-described MJR process, the tin, copper and niobium materials required to form the Nb3Sn are surrounded with a layer of barrier material which is selected from materials which effectively prevents diffusion of tin from the tin core into the copper matrix of the wire remotely located from the niobium and the subsequently formed Nb3Sn filaments. Wire thus formed contains both copper and non-copper areas, after

[1] I.W. Wu, et al, "The Influence of Magnesium addition to the bronze on the critical current of bronze–processed multifilamentary Nb3Sn", IEEE, Trans Mag-19, pp. 1437–1440, 1983.
[2] K. Togano et al, "Effects of Magnesium addition to the Cu-Sn Matrix in the Composite-Processed Nb3Sn Superconductor", Jour. of Less-Common Metals, 68, (1979), 15–22. reaction. Where the tin has reacted, substantially completely, both with the niobium and all the copper within or inside the barrier layer, the Nb3Sn filaments are surrounded by bronze.

While magnesium has been used heretofore in the production of niobium-containing products by the bronze process, that use causes substantial unwanted mechanical and physical anomalies resulting in a loss of ductility and poor workability when fabrication is attempted as well as problems with the higher temperatures required for processing.

As previously described, the most commonly used Nb3Sn wire product is made by the bronze process.

In many applications, magnetization, by definition, is a concern. A superconducting body has significant magnetization because of its ability to pin fluxoids (which is also why it can carry high currents). The magnetization at any field will be directly related to $J_c$ (the critical current density).

Magnetization (M) is also directly related to the superconducting area and hence the filament width.

$\Delta M \alpha J_c d$ where $d$ = filament diameter

While it would appear obvious that $\Delta M$ can be reduced by decreasing d, the reality is different. As the diameter is decreased, so is the spacing between filaments. During the heat treatment, closely spaced filaments may "bridge" together creating an effective filament diameter which is much larger (20–100 times) than an individual filament. This undesirable result is compounded by the expansion of the filament on conversion from Nb to Nb3Sn. From measurements of $\Delta M$ and $J_c$ a $d_{eff}$ (effective filament diameter) can be calculated.

One object of the present invention is to increase and enhance the critical current of Nb3Sn wire or rods while reducing the amount of bridging between filament elements.

Still another object is to control the growth of Nb3Sn grain size and insure the homogenous unimpeded distribution and diffusion of small grains by employing the conditions and structure which provide a homogenous distribution of Mg along the length of wire.

Yet another object is to produce, in situ at the locus of the niobium filament, finer grain growth of smaller grains of Nb3Sn (after reaction) and Mg2Sn (before reaction) to provide a wire structure capable of being worked into filamentous wire or rods for superconducting products.

A further objective is to provide a method of fabricating a wire structure capable of achieving the superconducting state while exhibiting a Nb3Sn current density greater than about 2600 Amps/mm² at 10 Tesla 4.2° K. and 10–13 ohmmeters.

A still further object of the present invention is to reduce the occurrence of bridging between filaments to thereby maintain as small an effective diameter of filament as possible after fabrication and reaction.

These and other objects are all accomplished while still retaining the fabricability of the metallic products such as wire and rods by the addition of small amounts of magnesium to the tin core of the tin core MJR.

We have unexpectedly found that magnesium content at the eutectic composition (~98% Sn, ~2% Mg) is enough to produce a dramatic increase in current density (overall) of about 20–30% without further dilution of the Nb3Sn current density, and produces a very fine 2(d) phase Mg2SN and the desired homogeneous dispersion by the radial diffusion of the eutectic either inwardly or outwardly.

Summary of the Invention

A tin-magnesium eutectic alloy is provided in combination with a copper matrix in a superconductor billet, bundle or wire structure such that the formation of excessively large intermetallic compositions, deleterious to current carrying ability and formability of the composite are avoided. This invention also provides a process capable of substantially and homogeneously distributing the magnesium alloy along the length of wires, rods and other products. As will be further described herein during the reaction heat treatment to produce $Nb_3Sn$ filaments, the magnesium is uniformly absorbed into the $Nb_3Sn$ at its locus of formation, resulting in a refined grain structure for the $Nb_3Sn$ and an improvement in the current carrying capability of the wire product over a wide range of applied magnetic field strengths.

Detailed Description of the Drawings

Referring to FIGS. 1A, 1B, 1C and 1D, the schematic representation shown is of the results of the fabrication steps in what will hereinafter be termed the modified jelly roll (MJR) process. A solid tin alloy core 10 is provided, which, according to the invention described herein, is a tin-magnesium eutectic alloy material containing from between about 1% to about 3% by weight of magnesium. Spirally wrapped around the tin alloy core are overlapping layers of an expanded metal 11 and layers of copper sheet 12. The expanded metal consists of niobium metal or various alloys of niobium metal including alloys with small amounts of titanium, tantalum, zirconium, hafnium, tin, iron, and vanadium.

Figure 1A:
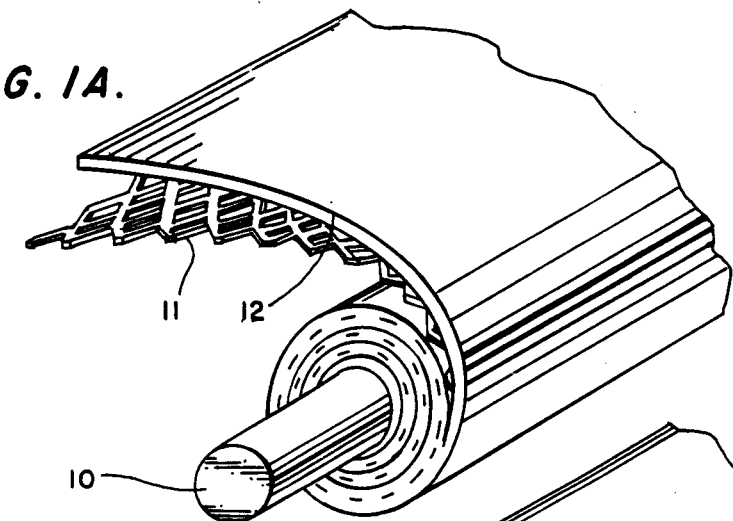
FIGS. 1A, 1B, 1C and 1D are schematic representations of the stages of the modified jelly roll process described herein for producing an improved $Nb_3Sn$ containing superconductor.
Figure 1B:
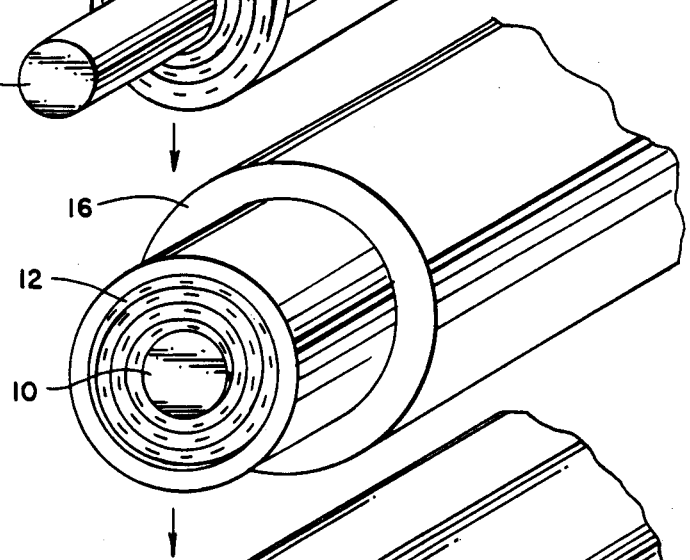
Figure 1C:
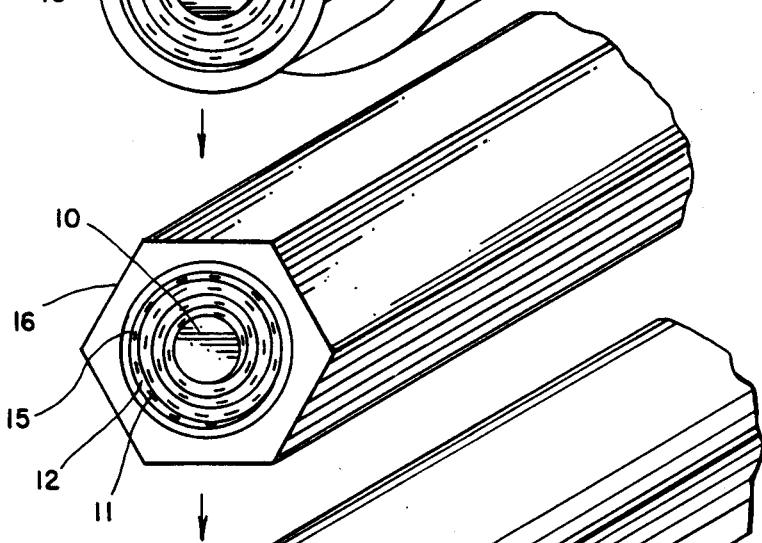
Figure 1D:
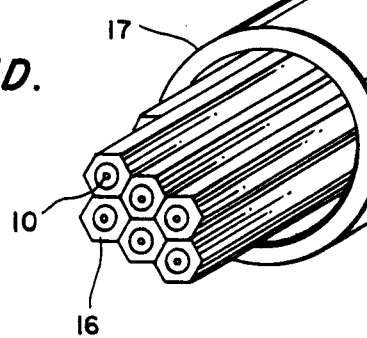
Figure 9:
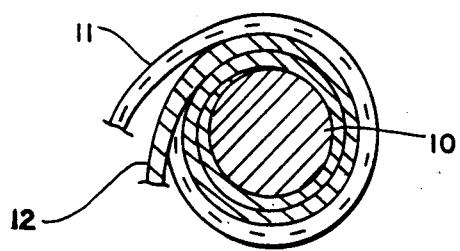
FIG. 9 is a partial cross-section of an alternative embodiment of FIG. 1A.
Figure 7:
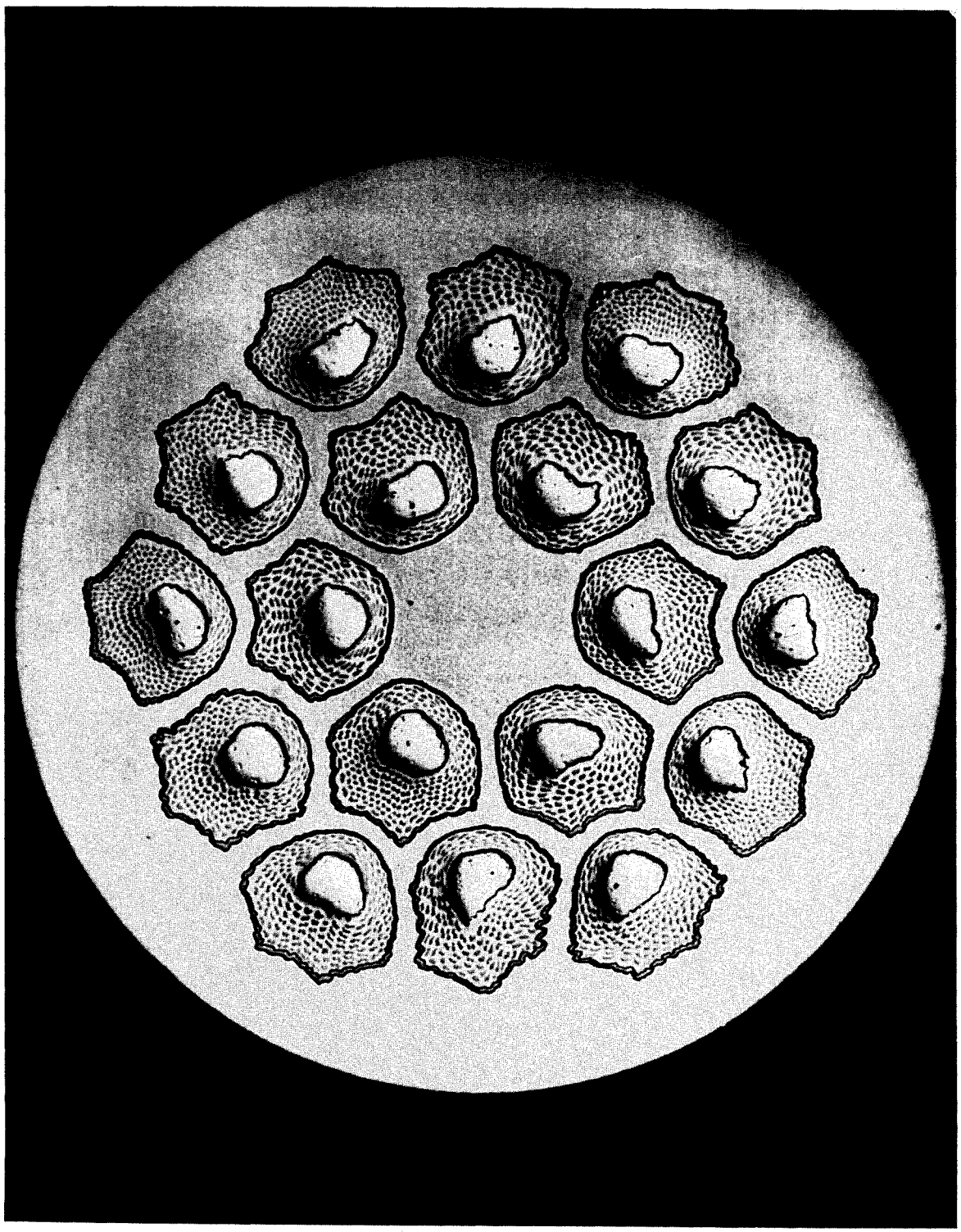
FIG. 7 is a photomicrograph of the wire produced by the process shown schematically in FIG. 1, before heat treatment.
Figure 8:
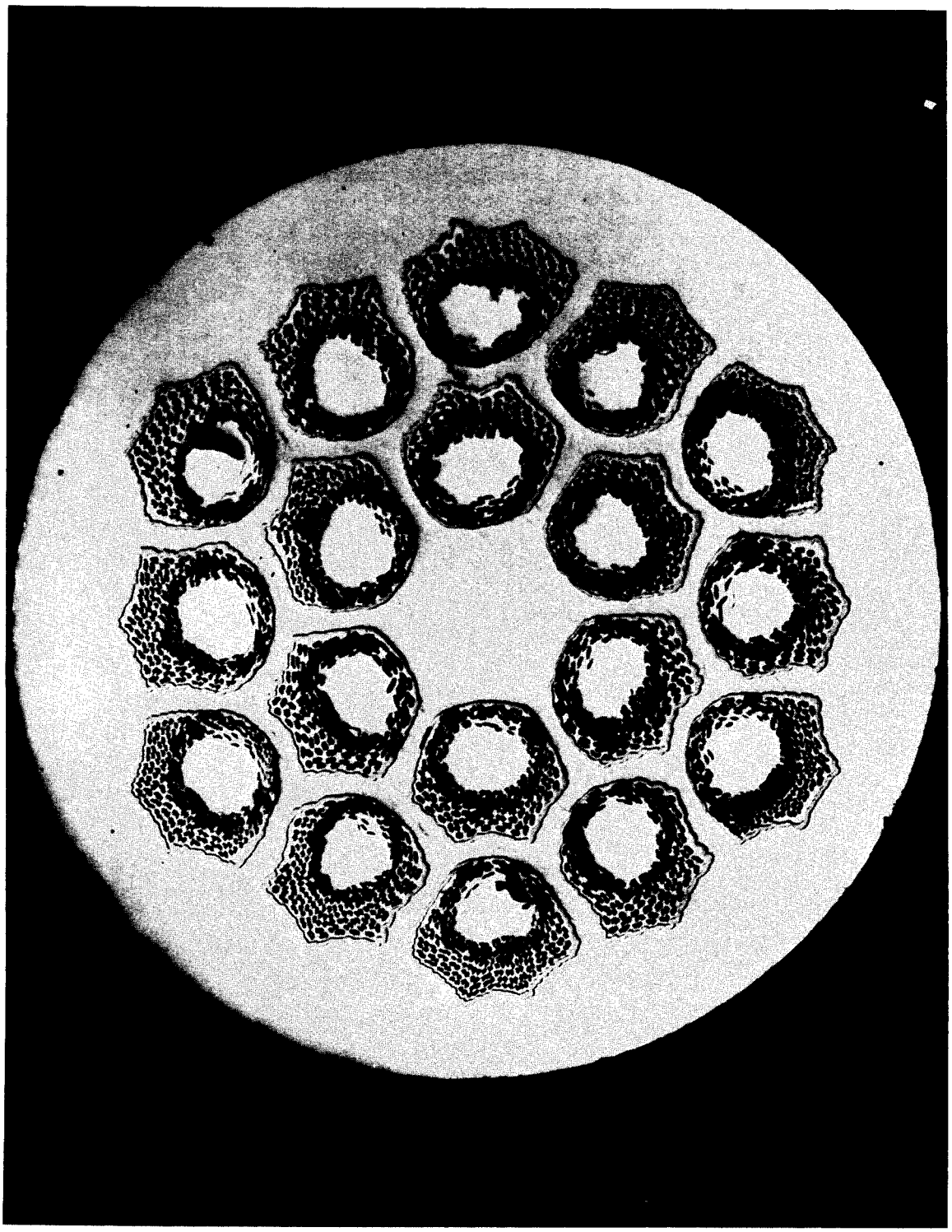
FIG. 8 is a photomicrograph of the wire of FIG. 5, after heat treatment.

The expanded metal wrap 11 is separated from other expanded metal by the thin sheet of copper 12. Typically, at least the first layer of wrap in contact with the tin alloy core 10 will be a copper sheet 12 followed radially outward by an expanded metal sheet or wrap 11 and then alternately followed by a further copper sheet and then expanded metal repeatedly. More preferably, as shown in FIG. 9, several wraps of copper are wound around the tin or tin alloy core before beginning the alternative niobium expanded metal and copper sheet construction shown at FIG. 1A. The cylinder or log of FIG. 1A is then given an outer wrap or wraps or cylindrical covering of a diffusion barrier 15 made from material such as vanadium, niobium, tantalum, or mixtures thereof, either physically mixed or alloyed. Preferably the tin alloy core and the annular copper wraps can occupy in the annular space around the tin core greater than about 12% of the space (area) contained within the diffusion barrier. The barrier containing structure B is then inserted into a cylinder of copper 16 to form a billet structure shown in FIG. 1C. The billet is then drawn repeatedly to the structure shown in FIG. 1D. Typically, the external hexagonal shape is provided and the final rods are about one-half inch in diameter. The hexagonal shape provides for better packing of the rods into a copper cylinder 17. The cylinder shown at FIG. 1E is completely filled with rods from FIG. 1D and additional drawing is employed to reduce the entire structure into a wire of from one-twentieth of an inch to one one-hundredths of an inch in diameter, which is shown in the photomicrographs of FIG. 7. FIG. 8 shows a cross-section of the wire of FIG. 7 after the step of heating the wire for at least 100 hours at a temperature of from between about 600° C. to about 800° C. Preferably the heat treating process is initiated at 200° C. to about 220° C. for about 100 hours, followed thereafter by heating to about 340° C. for about 48 hours and then heating to less than 800° C. for 100 to 200 hours. More preferably, the final heating step is conducted at between about 600° C. to about 700° C. and, more preferably, at about 675° C. for at least 100 hours.

Figure 2:
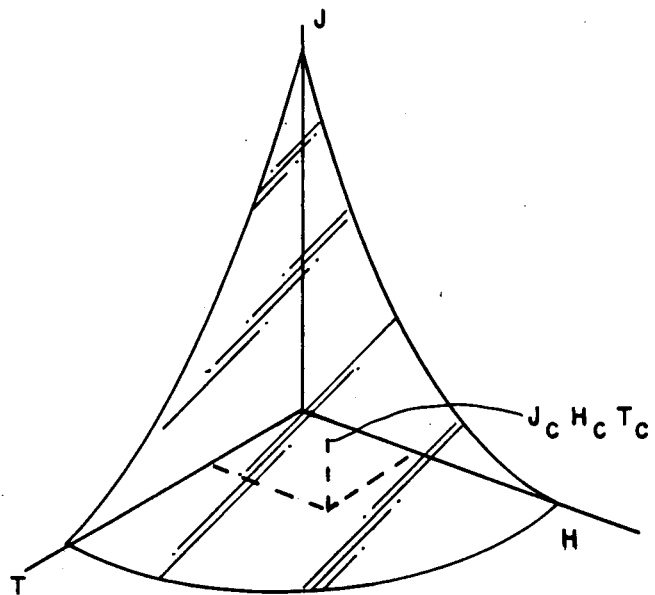
FIG. 2 is a graphic representation of how the variables of applied field, temperature and current flow interrelate to the formation of the superconducting state.

Referring to FIG. 2, a surface is depicted wherein a point on the surface defines the critical state where superconduction transition occurs. The relationships describe a point where critical current density $J_c$, critical field $H_c$ and critical temperature $T_c$ intersect and define the superconductivity boundary conditions for the sample being evaluated. Therefore, any set of conditions defining a point between the surface shown and the planes of the axes or origin describes a material in the superconducting state. Simply stated, the surface defines the following emperical relationships, i.e., the critical temperature ($T_c$) will decrease with an increase in value of either current (J) or field (H); and critical current ($J_c$) will decrease in value when either temperature (T) or field (H) increases; and critical field ($H_c$) will decrease in value when either temperature (T) or current (J) increases.

Figure 3:
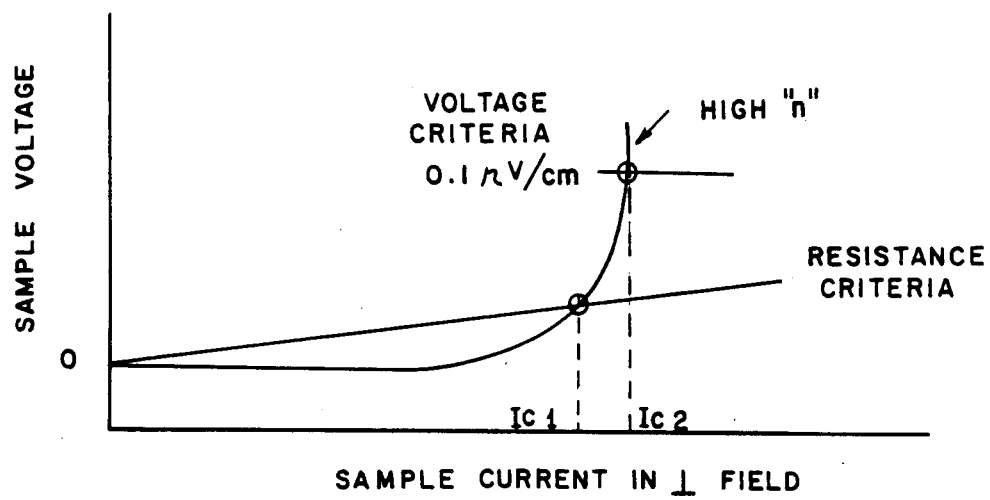
FIG. 3 is a graph of voltage across a sample as a function of applied current at a given magnetic field strength used to define the critical current of the sample.
Figure 4:
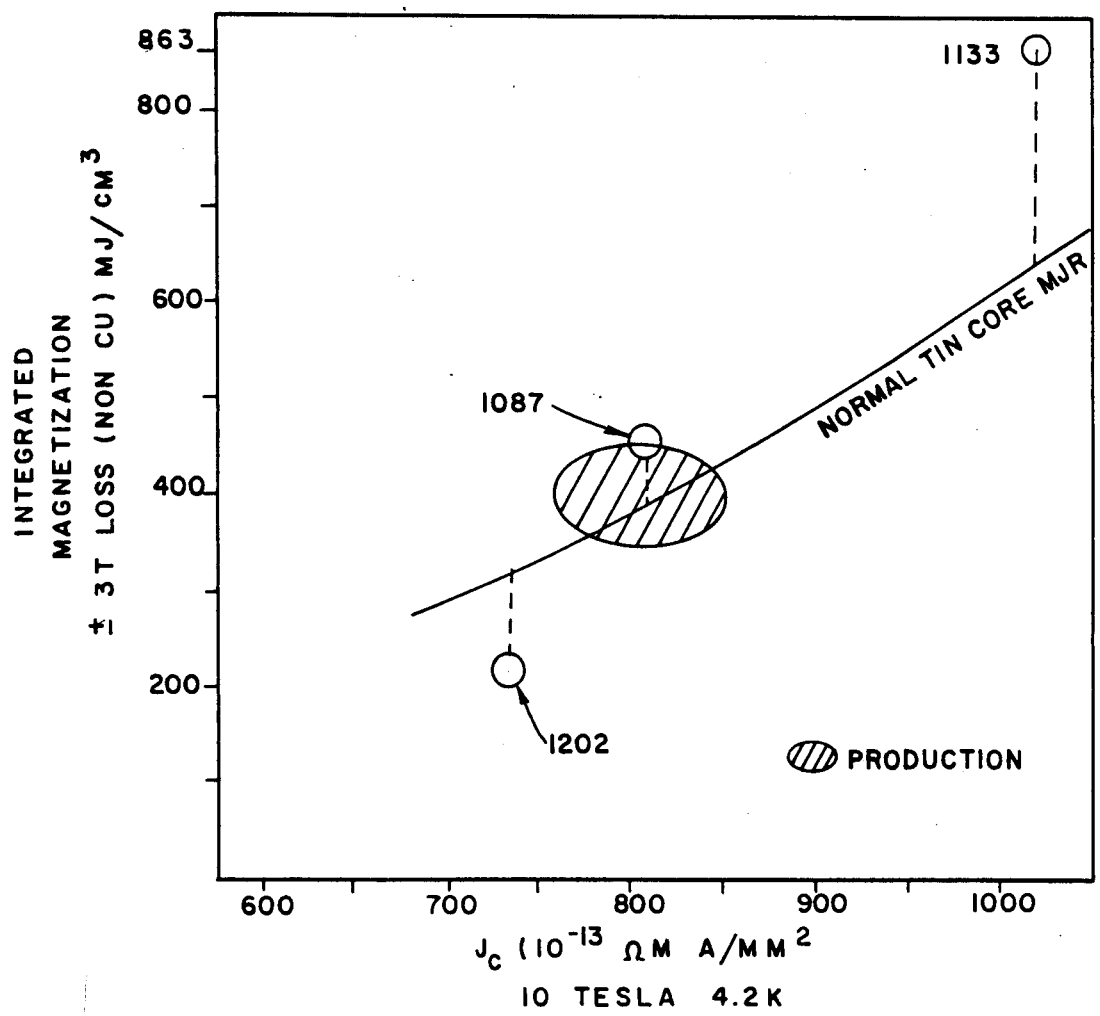
FIG. 4 is a graph showing the hysteresis loss (integrated magnetization over $\pm 3T$ cycle) against critical current ($J_c$) at 10 Tesla for various materials.

Referring to FIG. 3, the graph shows a typical transport current measurement which is used to evaluate different materials by a conventional method as defined in ASTM Specification B714-82 "Standard Test Method for D-C Critical Current of Composite Superconductors", ASTM Standards, Philadelphia, ASTM, 1982, which is incorporated herein, in its entirety by reference.

Wires were drawn from a control billet and billets comprising embodiments of the present invention wherein the core rods were respectively:

(1) Sn/0.7 wt. % Cu control (1087)
(2) Sn/1.8 wt. % Mg (1133) and (3) Sn/2.0 wt. % Mg (1202)

The wires were all drawn to 0.0307" and given the same heat treatment (optimum for 1087). 220° C./175 hr +340° C./96 hr+650° C./200 hr and exhibited the following characteristics:

| Unreacted Filament size | ~3.2 microns |
|---|---|
| Diffusion barrier | Vanadium |
| Local Matrix/filament ratio | ~1.7:1 |
| Filament Alloy | Nb 0.8 wt % Ti; matrix pure copper |
| # MJR elements in wire | 18 (except 1202, having 14 elements) |
| Fraction Non-copper in wire | ~46% (except 1202, having 35.5% non-copper) |

For each of the samples, the volume fraction of non-copper content (volume inside barrier layer) was as follows:

TABLE I

| | Non-copper content (volume fraction in %) | | |
|---|---|---|---|
| Lot.# | 1087 | 1133 | 1202 |
| Nb/0.8 Ti | 22.9 | 23.4 | 21.1 |
| Core Rd | 15.8 | 14.9 | 13.8 |
| Copper | 48.2 | 47.8 | 52.2 |
| Vanadium | 13.4 | 13.9 | 12.9 |
| Alloy in Tin Core | 0.7 Cu wt % | 1.8 Mg wt % | 2 Mg wt % |
| Local Ratio (copper around the filament) | 1.71 | 1.67 | 1.67 |

Critical current densities are obtained for each wire sample as follows:

TABLE II

| | | Non-Copper Area (A/mm$^2$) | | | | | | |
|---|---|---|---|---|---|---|---|---|
| | | 5 Tesla | | 8 Tesla | | 10 Tesla | | |
| "n" | Lot # | 0.1 μV/cm | 10$^{-13}$ Ωm | 0.1 | 10$^{-13}$ | 0.1 | 10$^{-13}$ | 10$^{-13}$ |
| 28–33 | 1087 | 1926 | 2059 | 1089 | 1161 | 758 | 795 | 840 |
| 38–50 | 1133 | 2556 | 2689 | 1443 | 1509 | 978 | 1019 | 828 |
| 33–37 | 1202 | 1897 | 2000 | 1056 | 1097 | 717 | 738 | 701 (predicted) |

Where "n", in the formula $V\alpha I^n$, is a description of the

TABLE III

| | | Hysteresis Loss (0.78 mm) | | |
|---|---|---|---|---|
| Lot# | +3T Cycle | (Non-Cu) Fraction | (Non-Cu) mJ/cm$^3$ | Loss/Jc(10T) |
| 1087 | 218 | .463 | 471 | 0.592 |
| 1133 | 399 | .4625 | 863 | 0.847 |
| 1202 | 75 | .355 | 211 | 0.286 |

Observations of reacted MJR elements reveal that the bridged filaments are located closest to the core and hence to the tin source. Thus, it is likely that the hysteresis loss is controlled by these filaments closest to the core. The gradient in tin concentration will result in a gradient in Nb$_3$Sn current density. The magnesium is unlikely to result in a change in the effective filament size while it is expected to increase the critical current density of filaments incorporating it.

Comparing 1087 and 1133 where only the 1.8 wt% Mg is the difference, the following results are obtained:

$$\frac{Jc\ (1133)}{Jc\ (1087)} = 1.28 \quad 10T, 10^{13}\ m$$

$$\frac{\text{Hysteresis (1133)}}{\text{Hysteresis (1087)}} = 1.83 \quad \pm 3T\ \text{cycle}$$

Assuming $d_{eff}$ is unchanged, then the loss data indicates that $J_c$ in the bridged filaments has been increased by 1.83 times while the overall current density (average) has only been increased 1.28 times. Simple algebra then shows that about 34% of the filaments must contribute to the loss and the benefit of Mg is clear.

Sample 1202 was subjected to similar reaction conditions as 1133 and 1087 and better filament separation was achieved. The result was significantly lower (factor of 2 over 1087) [factor of 3 over 1133] ±3T hysteresis loss and magnetization.

However, for sample 1202, the $J_c$ enhancement was not as great as expected though no control of the same geometry was run. It is believed that even though less Nb was employed, the increased amount of matrix around the internal filaments may have added significant pre-stress not normally encountered in the standard tin core MJR wires as described.

Figure 5:
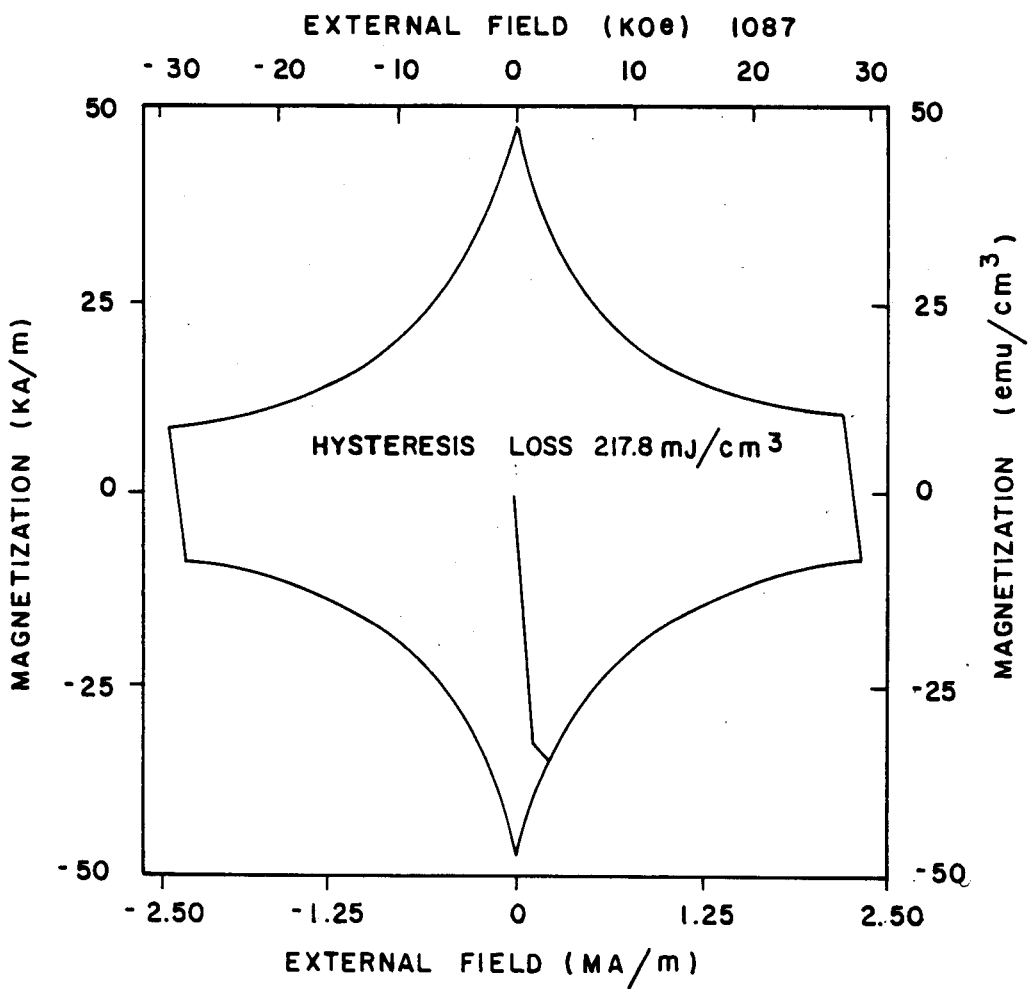
FIG. 5 is a graphical representation showing integration of magnetization as a function of applied field for a production superconductor described herein showing the hysteresis loss for a single cycle.
Figure 6:
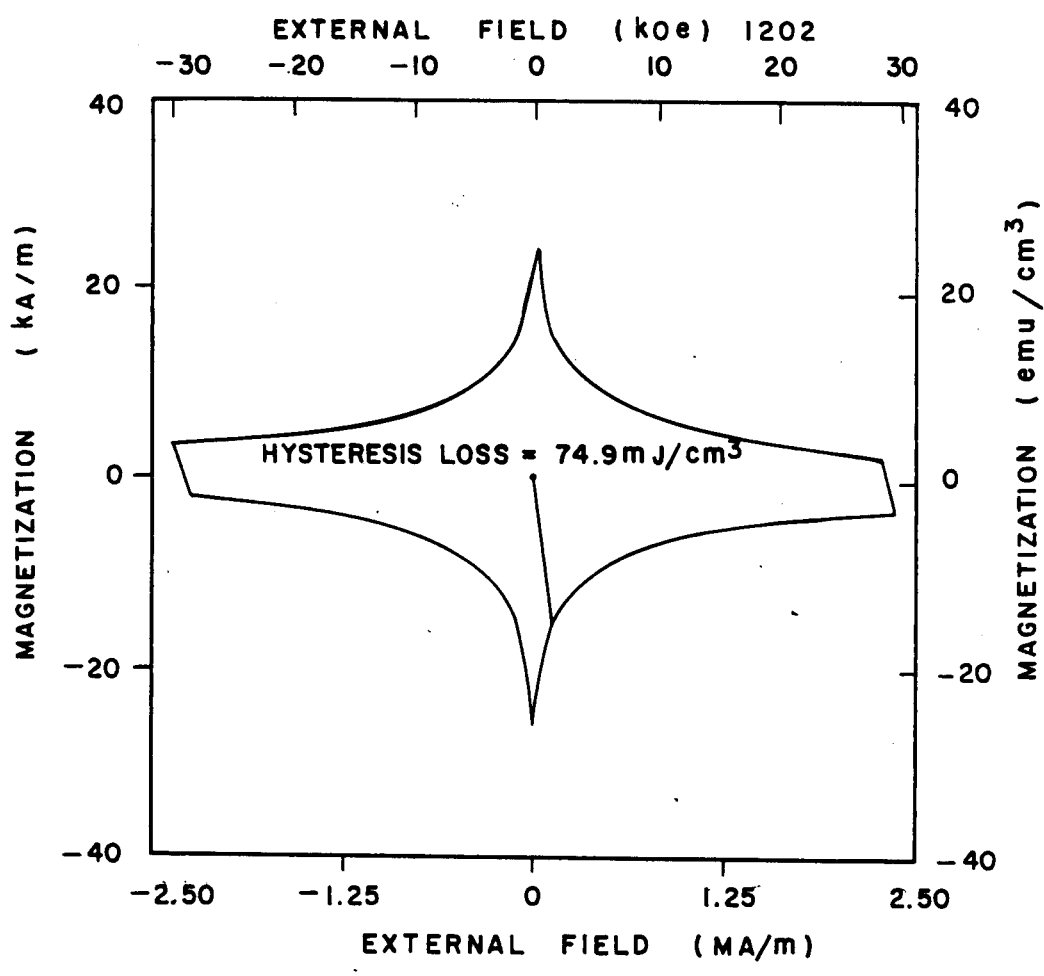
FIG. 6 is a graphical representation of magnetization as a function of applied field for the $Nb_3Sn$ superconductor of the present invention showing the hysteresis loss for a single cycle.

These results are graphically depicted in the FIGS. 5 and 6.

Further analysis of the foregoing data can provide a better understanding of the improvement provided by the use of a tin-magnesium eutectic in any structural form. Keeping in mind that the formation of the Nb$_3$Sn produces a volumetric expansion of approximately 1.35 times the volume of the original niobium, the following expression can be applied:

$$\frac{J_c\ (\text{Non-Copper})}{\%\ \text{Nb in Non-Copper} \times 1.35} = J_c(\text{Nb}_3\text{Sn})\ (\text{minimum average})$$

10 Telsa (10$^{-13}$ m) 4.2K

| Wire | % Nb in Non-Cu | J$_c$(Non-Cu) | J$_c$(Nb$_3$Sn) |
|---|---|---|---|
| 1087 | 22.9 | 795 A/mm$^2$ | 2571 A/mm$^2$ |
| 1133 | 23.4 | 1019 | 3226 |
| 1202 | 21.1 | 738 | 2591 |

Taking the foregoing data, we can calculate directly Nb$_3$Sn area (maximum potential):

Nb$_3$Sn Area = wire area x non-copper fraction x %Nb filament in non-copper × 1.35

This provides us with an indication that A15 grown by the diffusion of the present invention using the critical current density of the Nb$_3$Sn at 10$^{-13}$ Ωm criteria, 10 Tesla, 4.2 Kelvin will be as large or larger than a value of about 2600 A/mm$^2$.

While the foregoing description identified many variable that must be balanced in terms of useful metals and alloys for the various structural elements, including filament composition barrier layer composition core composition and the like, the described relationships in superconductor characteristics are still employed to evaluate the performance of the wire and provide the basis for deducing what changes can be made to produce predictable changes in specific performance and fabricability. It is contemplated, therefore, that the tin-magnesium eutectic core composition described herein can be employed with pure niobium or niobium alloyed with 0.05 to 10 wt. % Ta; 0.05 to 5 wt. % Ti; 0.05 to 10 wt. % Hf; 0.05 to 10 Wt. % Hf plus 0.05 to 5 wt. % Ti; 0.05 to 7 wt. % Zr; 0.05 to 7 wt. % Zr plus 0.05 to 5 wt. % Ti; 0.05 to 10 wt. % Ta plus 0.05 to 5 wt % Ti; and 0.05 to 7 wt. % Ta plus 0.05 to 7 wt. % Zr.

Likewise, as previously described, the unexpected improvement in conductivity and current density where less niobium is used and the copper content is increased around the tin core, can be expected to have utility with a wide variety of compositions and structures. It is anticipated that the improvements observed are obtained when the annular area of copper around the tin core is greater than 12% of the area within the barrier layer.

This invention has been described with respect to specific embodiments thereof. It will be readily appreciated that the scope of the claims appended hereto is to be limited only by the applicable prior art and that a breadth of equivalents are possible where the described parameters for properties are produced.

What is claimed is:

1. A method of making a wire conductor from niobium tin produced in situ in a filamentous composite structure capable of exhibiting the superconducting state comprising the steps of:

(a) providing a solid tin alloy core comprised of tin-magnesium eutectic alloy material;
    (b) overlapping said tin alloy core with alternating layers of copper and foraminous layers containing niobium;
    (c) forming niobium containing filaments in said copper by drawing the structure of (b) into wire;
    (d) heating the wire so produced at a high enough temperature for a sufficient period of time to cause the tin magnesium eutectic to diffuse through said copper and react with the Nb to form the A-15 crystal structure of Nb$_3$Sn.

2. The method of claim 1 wherein the heating of step (c) is effected first at between about 200 to 220° C. for about 100 hours, followed thereafter by heating at about 340° C. for about 48 hours, then followed by heating at about less than 800° C. for not less than about 100 to about 200 hours.

3. The method of claim 5 wherein the conductor is capable of exhibiting a current density of about 2600 Amps or more at 10 Tesla, 4.2° K. and at a magnetic field of 10$^{-13}$ ohmmeters.

4. The method of claim 1 further comprising the step prior to heating of covering the copper with a barrier diffusion layer of material selected from materials capable of preventing the diffusion of Sn away from the locus of the niobium during the step of heating.

5. The method of claim 2 wherein the final heating step is effected at from about 700°C. to about 600° C. for from not less than about 100 hours to about 200 hours.

6. The method of claim 4 wherein the barrier diffusion layer material comprises vanadium.

7. The method of claim 5 wherein the last heating is effected at about 675° C. for about 100 hours.

8. The method of claim 6 wherein the last heating effected at a temperature below which the barrier diffusion material selected does not react with copper.

9. The method of claim 8 wherein the last heating step is not more than about 675° C. and the barrier diffusion layer material comprises vanadium.

* * * * *